(12) United States Patent
Lu

(10) Patent No.: US 9,000,489 B2
(45) Date of Patent: Apr. 7, 2015

(54) LOCAL INTERCONNECTS FOR FIELD EFFECT TRANSISTOR DEVICES

(71) Applicant: International Business Machines Corporation, Armonk, NY (US)

(72) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/664,850

(22) Filed: Oct. 31, 2012

(65) Prior Publication Data

US 2014/0117453 A1    May 1, 2014

(51) Int. Cl.

| | | |
|---|---|---|
| *H01L 27/118* | (2006.01) | |
| *H01L 23/52* | (2006.01) | |
| *H01L 21/4763* | (2006.01) | |
| *H01L 21/44* | (2006.01) | |
| *H01L 21/311* | (2006.01) | |
| *H01L 21/302* | (2006.01) | |
| *H01L 29/417* | (2006.01) | |
| *H01L 29/78* | (2006.01) | |

(52) U.S. Cl.
CPC ........ *H01L 29/41791* (2013.01); *H01L 29/785* (2013.01)

(58) Field of Classification Search
None
See application file for complete search history.

(56) References Cited

U.S. PATENT DOCUMENTS

| | | | |
|---|---|---|---|
| H0842 H | * | 11/1990 | Ochs .............................. 257/767 |
| 6,802,050 B2 | | 10/2004 | Shen et al. |
| 7,339,241 B2 | | 3/2008 | Orlowski et al. |
| 7,414,275 B2 | | 8/2008 | Greenberg et al. |
| 7,453,125 B1 | | 11/2008 | Nielsen et al. |
| 7,851,283 B2 | | 12/2010 | Anderson et al. |
| 8,080,838 B2 | | 12/2011 | Chang et al. |
| 8,138,031 B2 | | 3/2012 | Yagishita |
| 8,168,497 B2 | | 5/2012 | Simin et al. |
| 8,175,523 B2 | | 5/2012 | Prikhodko et al. |
| 2011/0031556 A1 | | 2/2011 | Gossner |
| 2011/0068414 A1 | | 3/2011 | Anderson et al. |
| 2011/0244668 A1 | * | 10/2011 | Narihiro ....................... 438/479 |

* cited by examiner

*Primary Examiner* — Steven Loke
*Assistant Examiner* — Juanita B Rhodes
(74) *Attorney, Agent, or Firm* — Cantor Colburn LLP; Michael LeStrange

(57) ABSTRACT

A multi-field effect transistor (FET) device includes a first FET device arranged on a substrate, the first FET device including a first active region and a second active region, a second FET device arranged on the substrate, the second FET device including a first active region and a second active region, and a first conductive interconnect electrically connecting the first active region of the first FET device to the first active region of the second FET device, the first conductive interconnect having a first cross sectional area proximate to the first active region of the first FET device that is greater than a second cross sectional area proximate to the first active region of the second FET device.

3 Claims, 8 Drawing Sheets

LOCAL INTERCONNECTS FOR FIELD EFFECT TRANSISTOR DEVICES

BACKGROUND

The present invention relates to field effect transistor (FET) devices, and more specifically, to local interconnects for FET devices.

FET devices such as, for example, planar FETs, multi-gate FETs, tri-gate FETs, and FinFETs may be arranged on a substrate having a number of FET devices. The source and drain regions of the devices may be electrically connected by conductive interconnects. In this regard, FIG. 1 illustrates a top view of a prior art example of an arrangement of fin FET devices 102a-h each having a source region (104a, 104b, . . . , 104h) and a drain region (106a, 106b, . . . , 106h) defined by fins 108. A gate stack 110 is arranged over the fins 102. A first conductive local interconnect (interconnect) 112 is arranged in contact with each of the source regions 104a, 104b, . . . , 104h and a second conductive local interconnect 114 is arranged in contact with each of the drain regions 106a, 106b, . . . , 106h. A conductive via 116 is arranged proximate to a distal end of the first conductive local interconnect 112 and a conductive via 118 is arranged proximate to a distal end of the second conductive local interconnect 114. The vias 116 and 118 may be connected electrically to other circuitry or features to provide a voltage at the vias 116 and 118. A conductive via 120 is arranged in contact with the gate stack 110.

SUMMARY

According to an embodiment of the present invention, a multi-field effect transistor (FET) device includes a first FET device arranged on a substrate, the first FET device including a first active region and a second active region, a second FET device arranged on the substrate, the second FET device including a first active region and a second active region, and a first conductive interconnect electrically connecting the first active region of the first FET device to the first active region of the second FET device, the first conductive interconnect having a first cross sectional area proximate to the first active region of the first FET device that is greater than a second cross sectional area proximate to the first active region of the second FET device. According to another embodiment of the present invention, a multi-field effect transistor (FET) device includes a first FET device arranged on a substrate, the first FET device including a first active region and a second active region, a second FET device arranged on the substrate, the second FET device including a first active region and a second active region, a first conductive interconnect electrically connecting the first active region of the first FET device to the first active region of the second FET device, a second conductive interconnect electrically connecting the second active region of the first FET device to the second active region of the second FET device, a first current path defined by a first voltage contact point on the first conductive interconnect, a portion of the first conductive interconnect, the first FET device, the second conductive interconnect, and a voltage contact point on the second conductive interconnect, wherein the portion of the first conductive interconnect that partially defines the first current path has a first cross sectional area that is in contact with the first voltage contact point, and a second current path defined by the voltage contact point on the first conductive interconnect, a portion of the first conductive interconnect, the second FET device, the second conductive interconnect, and the voltage contact point on the second conductive interconnect, wherein the portion of the first conductive interconnect that partially defines the second current path has a second cross sectional area, the first cross sectional area is greater than the second cross sectional area.

According to yet another embodiment of the present invention, a multi-field effect transistor (FET) device includes a first FET device arranged on a substrate, the first FET device including a first active region and a second active region, a second FET device arranged on the substrate, the second FET device including a first active region and a second active region, a third FET device arranged on the substrate, the third FET device including a first active region and a second active region, a first conductive interconnect electrically connecting the first active region of the first FET device to the first active region of the second FET device, and the first active region of the second FET device to the first active region of the third FET device, a second conductive interconnect electrically connecting the second active region of the first FET device to the second active region of the second FET device and the second active region of the second FET device to the second active region of the third FET device, a first current path defined by a voltage contact point on the first conductive interconnect, a first portion of the first conductive interconnect, the first FET device, the second conductive interconnect, and a voltage contact point on the second conductive interconnect, and a second current path defined by the voltage contact point on the first conductive interconnect, the first portion of the first conductive interconnect, a second portion of the first conductive interconnect, the second FET device, the second conductive interconnect, and the voltage contact point on the second conductive interconnect, a third current path defined by the voltage contact point on the first conductive interconnect, the first portion of the first conductive interconnect, the second portion of the first conductive interconnect, a third portion of the first conductive interconnect, the third FET device, the second conductive interconnect, and the voltage contact point on the second conductive interconnect, wherein a cross sectional area of the first portion of the first conductive interconnect is greater than a cross sectional area of the second portion of the first conductive interconnect and the cross sectional area of the second portion of the first conductive interconnect is greater than a cross sectional area of the third portion of the first conductive interconnect.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
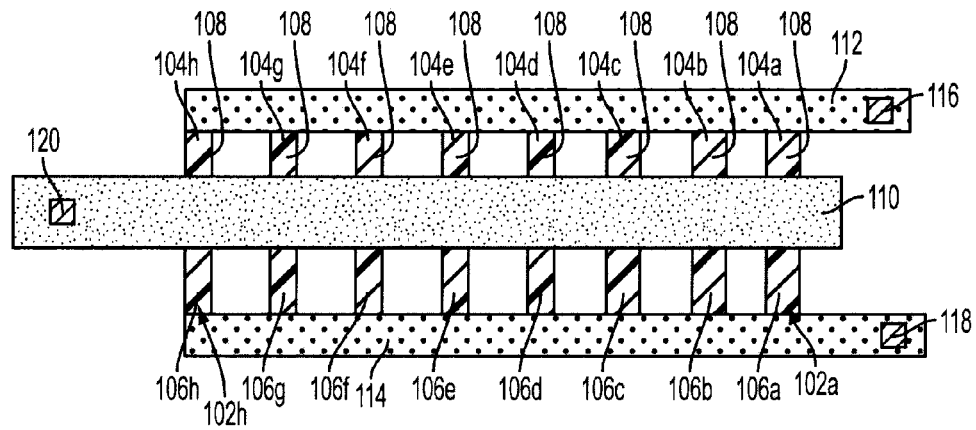
FIG. 1 illustrates a top view of a prior art example of an arrangement of FinFET devices.

Referring once again to the prior art arrangement in FIG. 1, in operation, if a voltage is applied across the vias 116 and 118, a plurality of current paths may be affected through each of the FinFET devices 102a-102h. Due to the resistance in interconnects 112 and 114 and the relative locations of the vias 116 and 118 and the devices 102h, there is a voltage drop on interconnect 112 from the location of 104a to the location of 104h. Thus, the voltage across the device 102h will be slightly less than the voltage across the device 102a due to the voltage drop on the interconnect 112 from 104a to 104h and the voltage drop on the interconnect 114 from 106h to 106a. In this regard, the voltage drop due to the resistance of the interconnects 112 and 114 may be generally calculated using Ohms law $R = \rho L/A$, where $\rho$ is the resistivity of the material used in the interconnects 112 and 114, L is the length of the interconnect (or length of the current path between the vias 116 and 118), and A is the area of the conducting cross section of the interconnect.

Noticing that the breakdown voltages for each of the devices 102a-h are substantially the same, it is desirable to apply a voltage across each of the devices 102a-h that is less than the breakdown voltage. Thus, for example, if a breakdown voltage is 2.1 volts (V), and a voltage of 2.0V is applied across the vias 116 and 118, the device 102a may receive approximately 1.9V applied thereto while the device 102n may receive 1.7V applied thereto due to a 0.1V voltage drop in the interconnect 112 from 104a to 104h and another 0.1V voltage drop in the interconnect 114 from 106h to 106a. Such an imbalance in the voltage applied to the individual devices 102 is undesirable since the device will operate more effectively and efficiently if each device 102a-h receives substantially the same voltage across the respective source regions 104 and 106.

Figure 2:
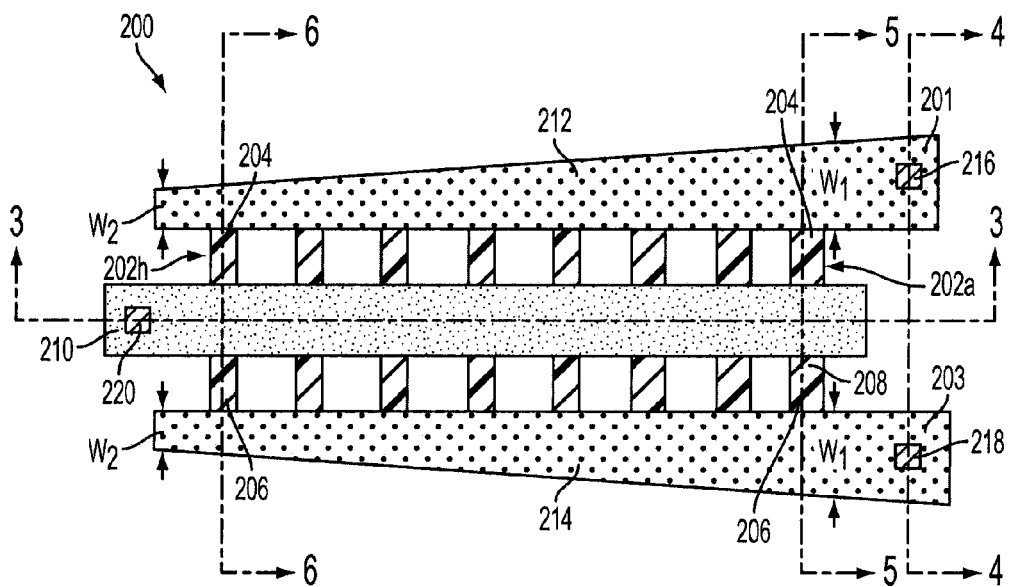
FIG. 2 illustrates a top view of an exemplary embodiment of a multi-FET device.

In this regard, FIG. 2 illustrates a top view (with some layers of material not shown for clarity) of an exemplary embodiment of a multi-FET device 200 that includes a plurality of FinFET devices 202a-h each having a source region 204 and a drain region 206 (active regions) defined by fins 208. A gate stack 210 is arranged over the fins 208. Though the illustrated embodiment includes FinFET devices, alternate exemplary embodiments may include any multi-FET device that includes an arrangement of FET devices such as, planar FETs, tri-gate FETs, nanowire FETs, or other multi-gate FET devices. The source regions 204 are electrically connected with each other by a conductive local interconnect (interconnect) 212, and the drain regions 206 are electrically connected with each other by an interconnect 214. A conductive via (via) 216 is arranged in contact with a region proximate to a first distal end 201 of the interconnect 212 and a via 218 is arranged in contact with a region proximate to a first distal end 203 of the interconnect 214. A via 220 is arranged in contact with the gate stack 210. The vias 216 and 218 may include, for example, vertically arranged contact points that pass through layers of insulator material arranged over the devices 202a-h. The vias 216, 218, and 220 may also represent contact points where voltage may be applied to the multi-FET device 200.

The interconnect 212 has a tapered width such that the width ($W_1$) proximate to the via 216 and the device 202a is greater than the width ($W_2$) that is proximate to the device 202n. The difference in the widths along the length of the interconnect 212 changes the area of the cross section of the interconnect 212 such that the cross sectional area proximate to the device 202a (which has a shorter current path defined by the via 216, the interconnect 212, the device 202a, the interconnect 214, and the via 218) is greater than the cross sectional area of the interconnect 212 proximate to the device 202h (which has a longer current path defined by the via 216, the interconnect 212, the device 202h, the interconnect 214, and the via 218). The interconnect 214 is arranged in a similar manner having a tapered width as illustrated. The change in the cross sectional area of the interconnects 212 and 214 provides less resistance per unit length in the interconnects 212 and 214 proximate to the devices 202 having shorter current paths and greater resistance per unit length in the interconnects 212 and 214 in the devices 202 having longer current paths. The difference in the resistance in the respective current paths provides each device 202 with a voltage that is substantially similar.

In this regard, the dividing of the current as the current travels across each device 202 results in a voltage drop that is different across each device 202. By reducing the cross sectional area of the interconnects 212 and 214 along the current paths in the device 200, the current density may remain substantially constant in the interconnects 212 and 214 for a given voltage that is applied to each interconnect 212 and 2142. The substantially constant current density in the interconnects 212 and 214 decreases the relative difference in voltage drops across the devices 202.

Figure 3:
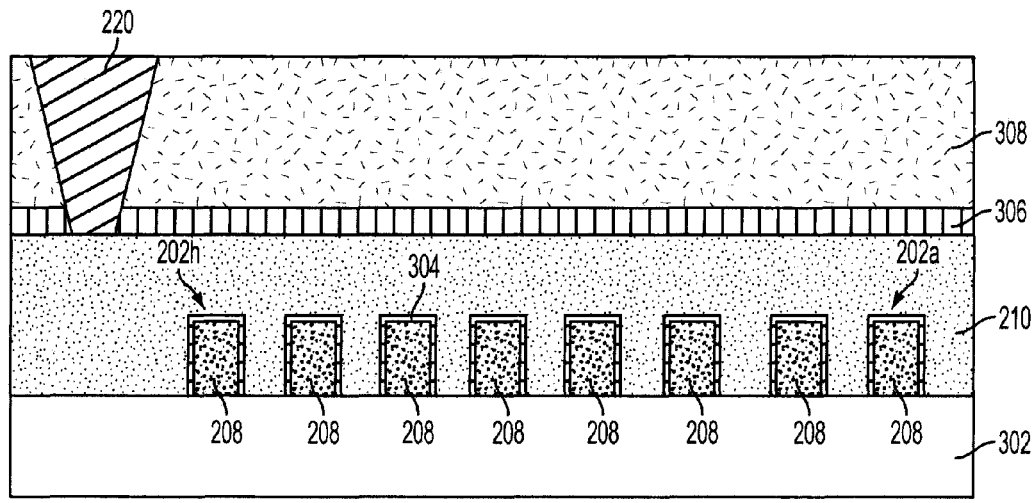
FIG. 3 illustrates a cut away view along the line 3 of FIG. 2.

FIG. 3 illustrates a cut away view along the line 3 (of FIG. 2). In this regard, the fins 208 are shown arranged on a substrate 302 with the gate stack 210 arranged over the fins 208. The gate stack 210 may include any number of layers of gate materials 304 formed over the fins 208. The fins 208 may include any suitable semiconductor material. A capping layer 306 that may include, for example, an oxide or nitride material may be arranged over the gate stack, and an insulator layer 308 that includes, for example, an insulator or dielectric material may be arranged over the capping layer 306. The illustrated exemplary embodiment is merely an example; any suitable arrangement of FET devices having any variety of materials may be used in alternate embodiments.

Figure 4:
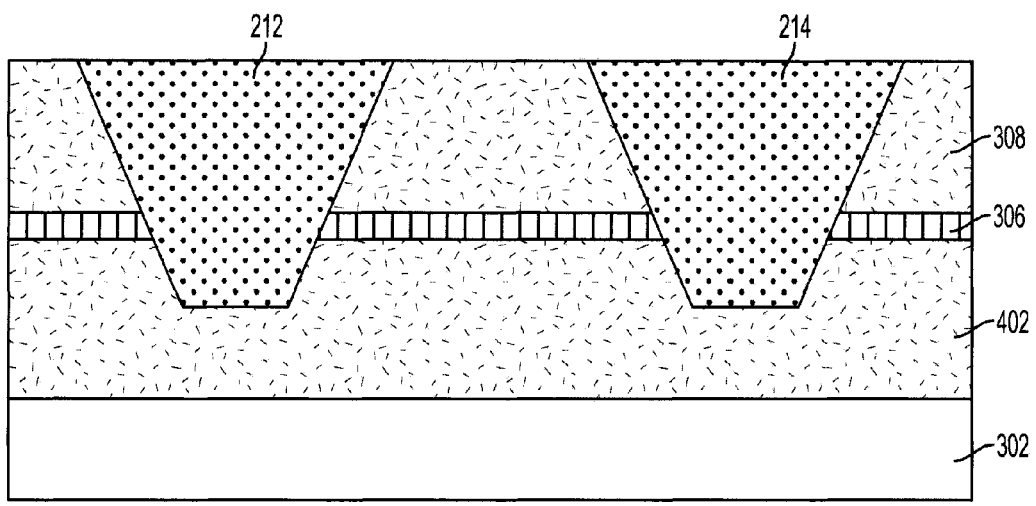
FIG. 4 illustrates a cut away view along the line 4 of FIG. 2.

FIG. 4 illustrates a cut away view along the line 4 (of FIG. 2). In this regard, an insulator layer 402 is arranged on the substrate 302, and the capping layer 306 is arranged over the insulator layer 402. The insulator layer 402 may include, for example an oxide or nitride material and may be similar to the insulator layer 308.

Figure 5:
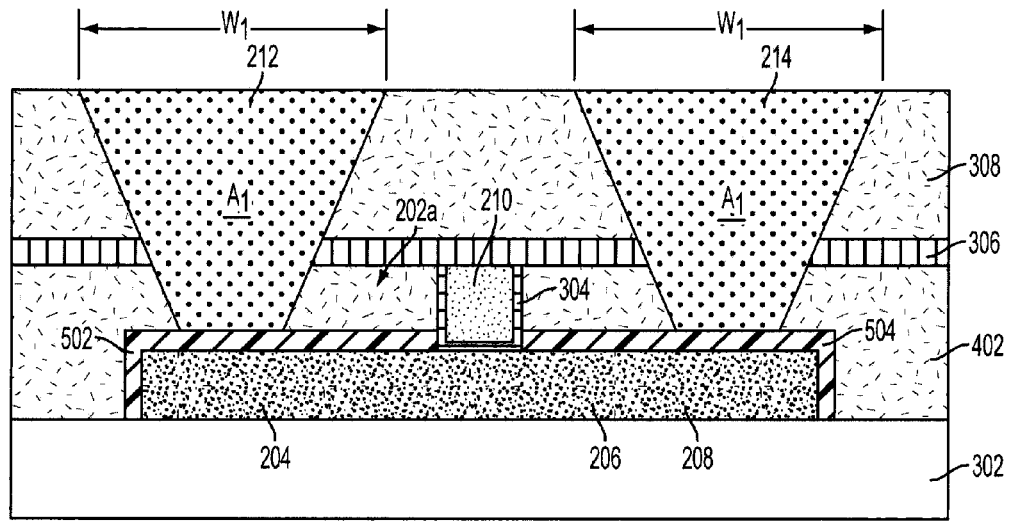
FIG. 5 illustrates a cut away view along the line 5 of FIG. 2.

FIG. 5 illustrates a cut away view along the line 5 (of FIG. 2). In this regard, an epitaxially grown semiconductor material 502 and 504 is shown grown from the source and drain regions 204 and 206 respectively. The interconnects 212 and 214 each define a cross sectional area ($A_1$) proximate to the device 202a.

Figure 6:
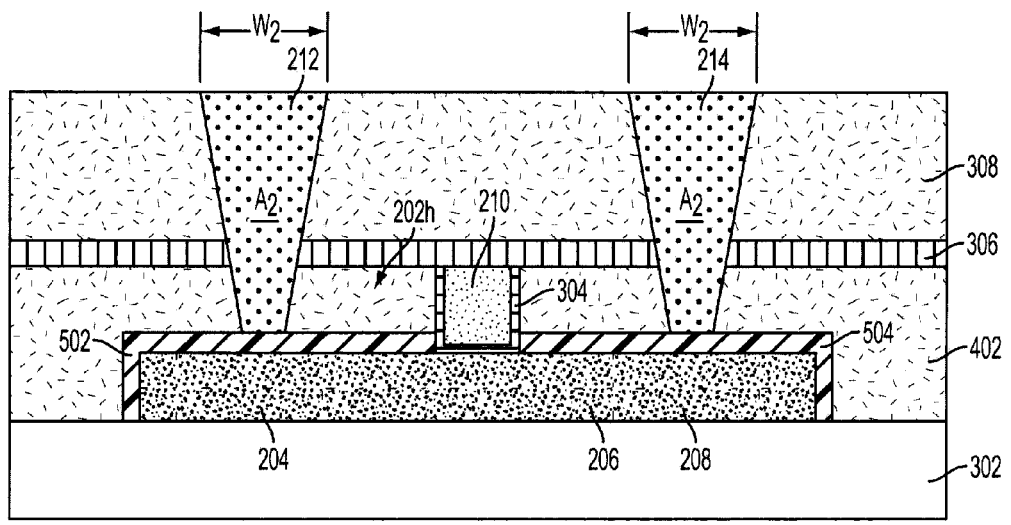
FIG. 6 illustrates a cut away view along the line 6 of FIG. 2.

FIG. 6 illustrates a cut away view along the line 6 (of FIG. 2). The interconnects 212 and 214 each define a cross sectional area ($A_2$) proximate to the device 202n. The cross sectional area $A_2$ is less than the cross sectional area $A_1$.

Figure 7:
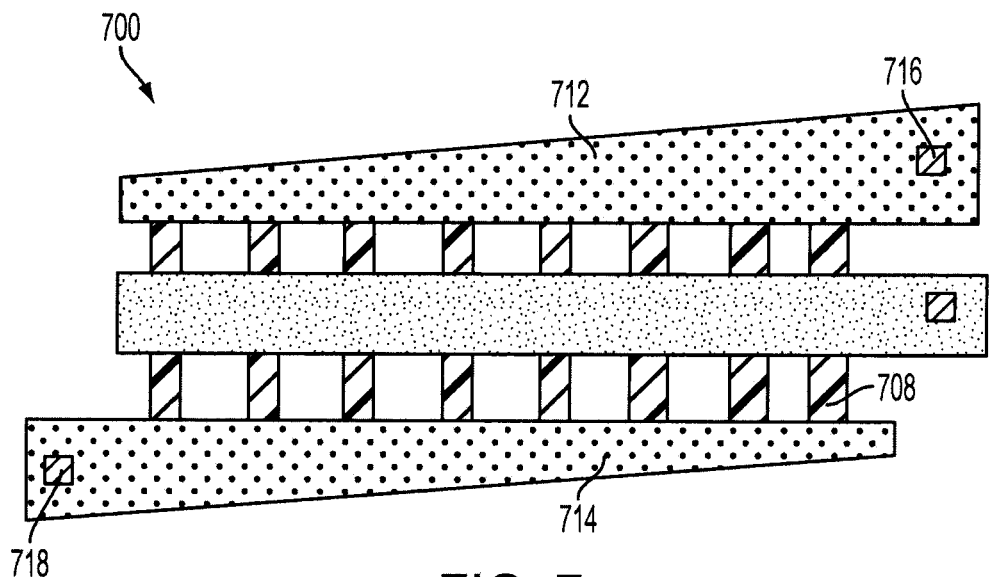
FIG. 7 illustrates a top view of another exemplary embodiment of a multi-FET device.

FIG. 7 illustrates a top view (with some layers of material not shown for clarity) of another exemplary embodiment of a multi-FET device 700 that includes an alternate arrangement of interconnects 712 and 714. The device 700 is similar in operation to the devices described above. However, the interconnects 712 and 714 are arranged such that the cross sectional areas of the interconnects are not the same where the interconnects 712 and 714 contact respective source and drain regions. The location of the widest width of the interconnect 712 is at the location of via 716, which is a common connection point on the source side of drain currents from all fins 708. Similarly, the location of the widest width of the interconnect 714 is at the location of via 718, which is a common connection point on the drain side of drain currents from all fins 708.

Figure 8:
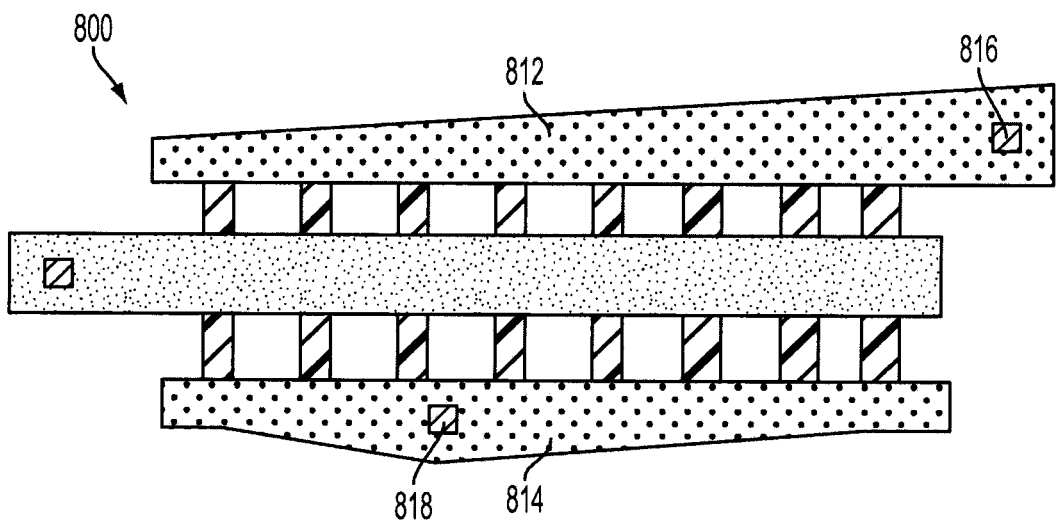
FIG. 8 illustrates a top view of another exemplary embodiment of a multi-FET device.

FIG. 8 illustrates a top view (with some layers of material not shown for clarity) of another exemplary embodiment of a multi-FET device 800 that includes an alternate arrangement of interconnects 812 and 814. The device 800 is similar in operation to the devices described above. The interconnect 812 and the arrangement of the via 816 is similar to the arrangement of the interconnect 212 (of FIG. 2) described above. The interconnect 814 and via 818 are arranged such that the interconnect 814 has a greater cross sectional area closer to a medial portion of the device 800. The location of the widest width of the interconnect 812 is at the location of via 816, which is a common connection point on the drain side of drain currents from all fins. Similarly, the location of the widest width of the interconnect 814 is at the location of via 818, which is a common connection point on the source side of drain currents from all fins.

Figure 9:
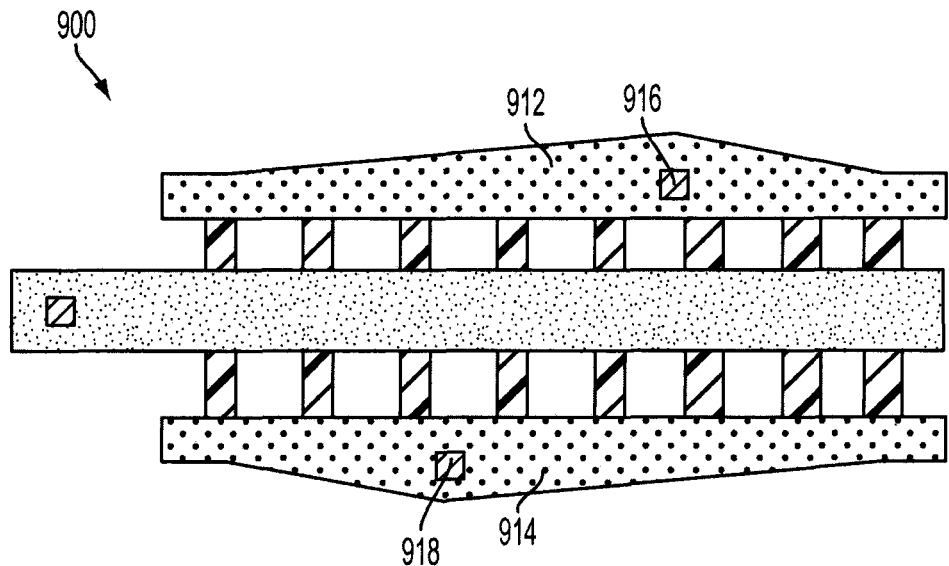
FIG. 9 illustrates a top view of another exemplary embodiment of a multi-FET device.

FIG. 9 illustrates a top view (with some layers of material not shown for clarity) of another exemplary embodiment of a multi-FET device 900 that includes an alternate arrangement of interconnects 912 and 914. The device 900 is similar in operation to the devices described above. The interconnect 912 and the arrangement of the via 916 is similar to the arrangement of the interconnect 814 (of FIG. 8) described above, i.e., is within the first fin and the last fin. The interconnect 914 and via 918 are arranged similarly to the interconnect 814 (of FIG. 8) described above, i.e., is within the first fin and the last fin. The location of the widest width of the interconnect 912 is at the location of via 916, which is a common connection point on the source side of drain currents from all fins. Similarly, the location of the widest width of the interconnect 914 is at the location of via 918, which is a common connection point on the drain side of drain currents from all fins. In the horizontal (X) direction, the location of the via 916 is different from that of the via 918.

Figure 10:
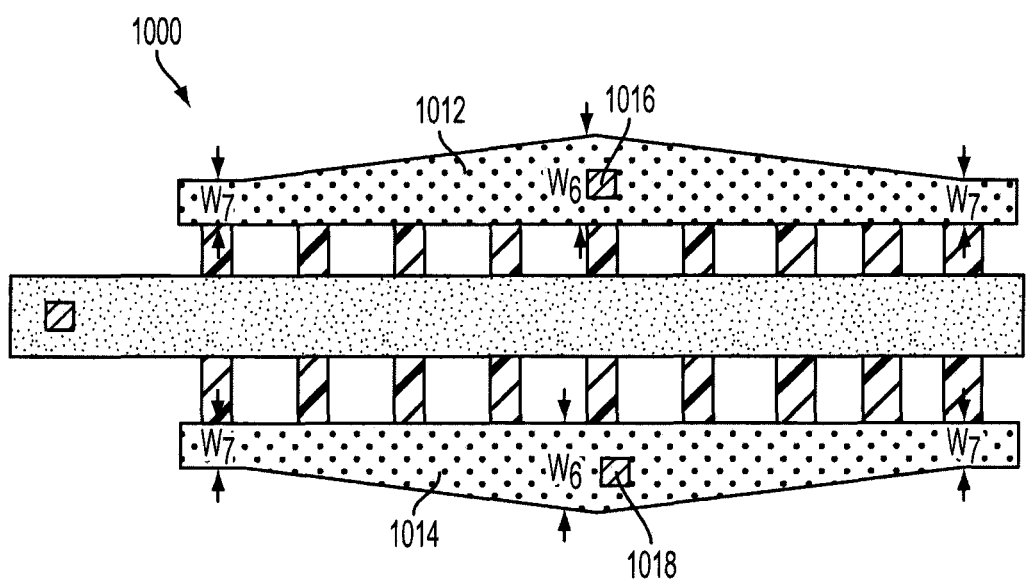
FIG. 10 illustrates a top view of another exemplary embodiment of a multi-FET device.

FIG. 10 illustrates a top view (with some layers of material not shown for clarity) of another exemplary embodiment of a multi-FET device 1000 that includes an alternate arrangement of interconnects 1012 and 1014. The device 1000 is similar in operation to the devices described above. The interconnect 1012 and the arrangement of the via 1016 is such that the via 1016 is arranged proximate to a medial region of the interconnect 1012 having a width ($W_6$). Distal ends of the interconnect 1012 each have a width ($W_7$). The interconnect 1014 and the via 1018 are arranged similarly to the interconnect 1012 and via 1016. In the illustrated embodiment $W_6$ is greater than $W_7$ and the widths correspond to differences in cross sectional areas of the interconnects 1012 and 1014. The location of the widest width of the interconnect 1012 is at the location of via 1016, which is a common connection point on the source side of drain currents from all fins. Similarly, the location of the widest width of the interconnect 1014 is at the location of via 1018, which is a common connection point on the drain side of drain currents from all fins. In the horizontal (X) direction, the locations of both vias 1016 an 1018 are at the middle of the device.

Figure 11:
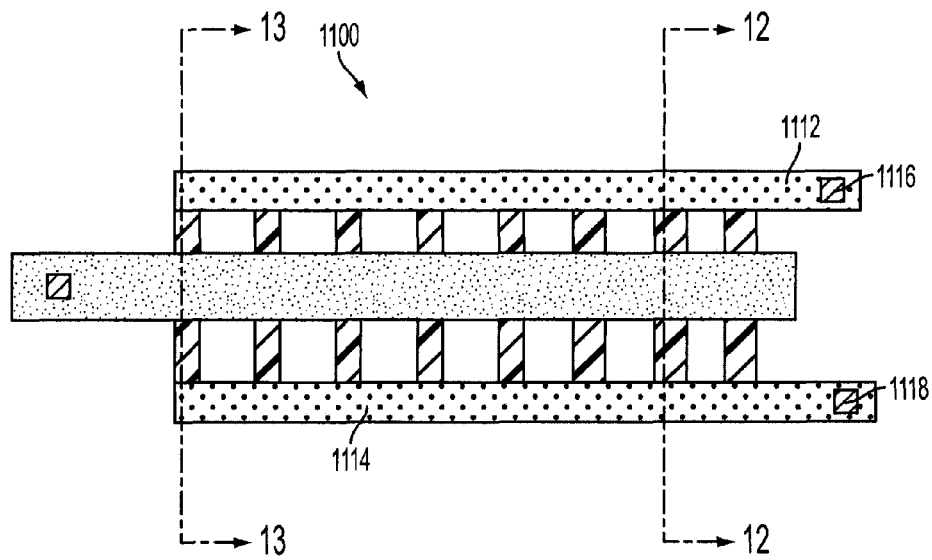
FIG. 11 illustrates a top view of another exemplary embodiment of a multi-FET device.

FIG. 11 illustrates a top view (with some layers of material not shown for clarity) of another exemplary embodiment of a multi-FET device 1100 that includes an alternate arrangement of interconnects 1112 and 1114. The device 1100 is similar in operation to the devices described above. In the illustrated embodiment, the widths of the interconnects 1112 and 1114 remain substantially constant, but the thicknesses of the interconnects 1112 and 1114 changes along the length of the interconnects 1112 and 1114 to vary the cross sectional area of the interconnects 1112 and 1114 resulting in similar advantages in performance described above.

Figure 12:
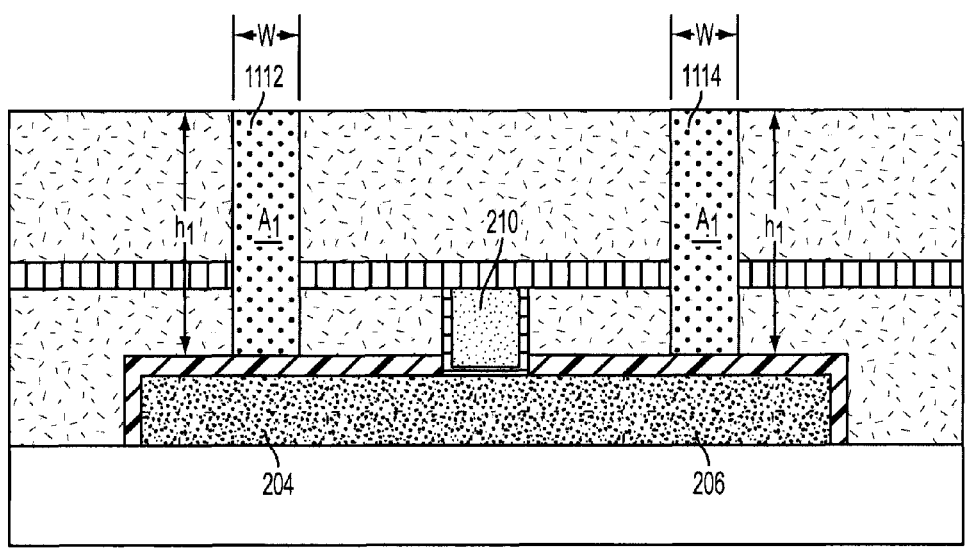
FIG. 12 illustrates a cut away view along the line 12 of FIG. 11.

FIG. 12 illustrates a cut away view along the line 12 (of FIG. 11). The interconnects 1112 and 1114 are shown with a height ($h_1$) and a width (w). The height and width define a cross sectional area ($A_1$).

Figure 13:
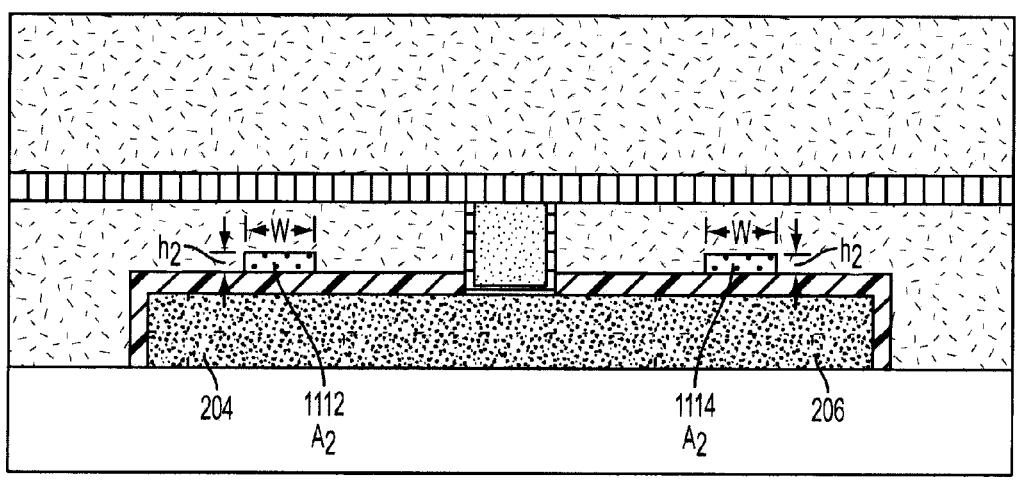
FIG. 13 illustrates a cut away view along the line 13 of FIG. 11.

FIG. 13 illustrates a cut away view along the line 13 (of FIG. 11). The interconnects 1112 and 1114 are shown with a height ($h_2$) and a width (w). The height and width define a cross sectional area ($A_2$). In the illustrated embodiment, $h_1$ is greater than $h_2$ and width w remains constant in the interconnects 1112 and 1114, thus $A_1$ is greater than $A_2$. In other words, the closer it is to vias 1116 and 1118, the wider the cross sectional area along interconnects 1112 and 1114. Moving closer to via 1116 along interconnect 1112, there is more drain currents in the interconnect 1112, and the passage area in interconnect 1112 for the current becomes larger. This reduces the voltage drop along interconnect 1112 from one fin to the next fin. Similarly, moving closer to via 1118 along interconnect 1114, there is more drain currents in the interconnect 1114, and the passage area in interconnect 1114 for the current becomes larger. This also reduces the voltage drop along interconnect 1114 from one fin to the next fin.

Figure 14:
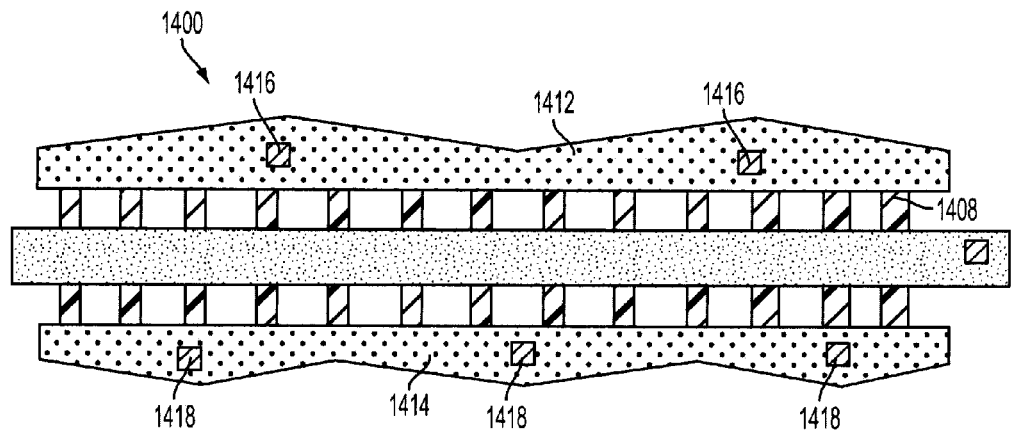
FIG. 14 illustrates a top view of another exemplary embodiment of a multi-FET device.

FIG. 14 illustrates a top view (with some layers of material not shown for clarity) of another exemplary embodiment of a multi-FET device 1400 that includes an alternate arrangement of interconnects 1412 and 1414. The device 1400 is similar in operation to the devices described above. However, the device 1400 includes a plurality of vias 1416 and 1418. The interconnects 1412 and 1414 have a greater cross sectional area in the regions where the vias 1416 and 1418 contact the interconnects 1412 and 1414. The location of the wider widths of the interconnect 1412 is at the location of vias 1416, which is a common connection point on the source side of drain currents from all fins 1408. Similarly, the location of the wider widths of the interconnect 1414 is at the location of vias 1418, which is a common connection point on the drain side of drain currents from all fins 1408.

Figure 15:
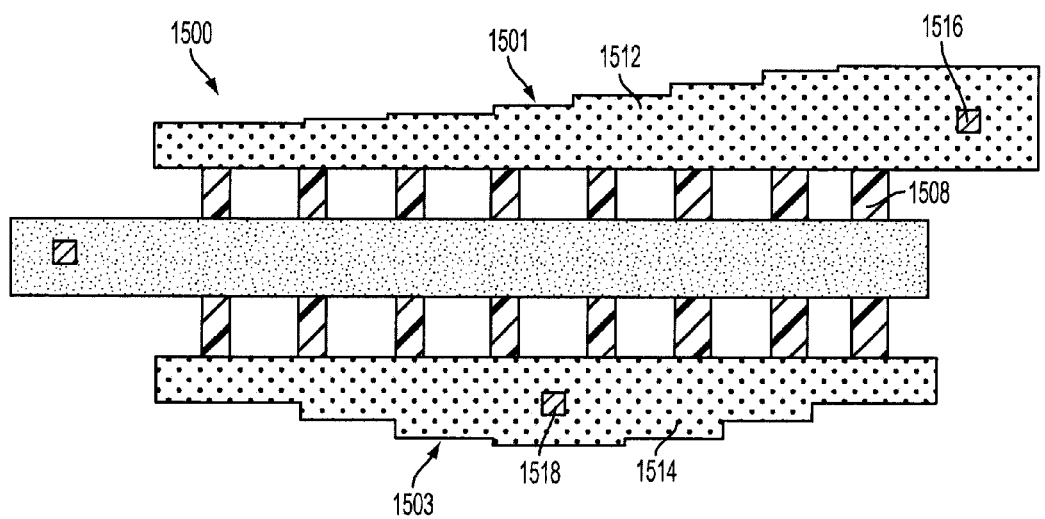
FIG. 15 illustrates a top view of another exemplary embodiment of a multi-FET device.

FIG. 15 illustrates a top view (with some layers of material not shown for clarity) of another exemplary embodiment of a multi-FET device 1500 that includes an alternate arrangement of interconnects 1512 and 1514. The device 1500 is similar in operation to the devices described above. The interconnect 1512 and the arrangement of the via 1516 is similar to the arrangement of the interconnect 212 (of FIG. 2) described above. However, the interconnect 1512 includes a stepped profile 1501. The interconnect 1514 and via 1518 are arranged similarly to the interconnect 814 (of FIG. 8) described above. However, the interconnect 1514 includes a stepped profile 1503. The location of the widest width of the interconnect 1512 is at the location of via 1516, which is a common connection point on the drain side of drain currents from all fins. Similarly, the location of the widest width of the interconnect 1514 is at the location of via 1518, which is a common connection point on the source side of drain currents from all fins.

Though the embodiments described above include some interconnects with varying widths and some interconnects with varying heights, alternate embodiments may vary both the width and the heights of the interconnects to achieve a desired cross sectional area of the interconnect relative to the vias and the FET devices. By changing the cross sectional areas of the interconnects relative to the vias and the individual FET devices, the relative differences in voltage drops for each current path in the multi-FET device may be minimized resulting in improved overall performance of the multi-FET device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A multi-field effect transistor (FET) device comprising:
 a first FET device arranged on a substrate, the first FET device including a first active region and a second active region;
 a second FET device arranged on the substrate, the second FET device including a first active region and a second active region;
 a first conductive interconnect electrically connecting the first active region of the first FET device to the first active region of the second FET device, the first conductive interconnect having a first cross sectional area proximate to the first active region of the first FET device that is greater than a second cross sectional area proximate to the first active region of the second FET device;
 a first conductive via arranged proximate to a first distal end of the first conductive interconnect, the first conductive via in contact with the first conductive interconnect in a portion of the first conductive interconnect having the first cross sectional area;
 a second conductive interconnect electrically connecting the second active region of the first FET device to the second active region of the second FET device, the second conductive interconnect having a first cross sectional area proximate to the second active region of the first FET device that is greater than a second cross sectional area proximate to the second active region of the second FET device;
 a second conductive via arranged proximate to a first distal end of the second conductive interconnect, the second conductive via in contact with the second conductive interconnect in a portion of the second conductive interconnect having the first cross sectional area;
 a third conductive via in contact with a gate stack of the first and the second FET devices,
 wherein the first, second, and third conductive vias are contact points where a voltage is applied to the first and second FETs of the multi-field effect transistor device.

2. The device of claim 1, further comprising a third FET device arranged on the substrate, the third FET device including a first active region and a second active region, wherein the first conductive interconnect electrically connects the first active region of the first FET device to the first active region of the second FET device and the first active region of the third FET device, the first conductive interconnect having a third cross sectional area proximate to the first active region of the third FET device that is greater than the second cross sectional area proximate to the first active region of the second FET device.

3. The device of claim 1, wherein the first active region of the first FET device is a source region, and the second active region of the first FET device is a drain region.

* * * * *